United States Patent [19]

Sakai

[11] 4,128,845
[45] Dec. 5, 1978

[54] SEMICONDUCTOR INTEGRATED CIRCUIT DEVICES HAVING INVERTED FRUSTUM-SHAPE CONTACT LAYERS

[75] Inventor: Tetsushi Sakai, Tachikawa, Japan

[73] Assignee: Nippon Telegraph and Telephone Public Corp., Japan

[21] Appl. No.: 706,596

[22] Filed: Jul. 19, 1976

[30] Foreign Application Priority Data

Jul. 28, 1975 [JP] Japan .................................. 50-91090

[51] Int. Cl.² ...................... H01L 29/70; H01L 23/48
[52] U.S. Cl. ......................................... 357/51; 357/34; 357/55; 357/59; 357/68
[58] Field of Search ....................... 357/40, 34, 59, 51, 357/55, 68

[56] References Cited

U.S. PATENT DOCUMENTS

| | | | |
|---|---|---|---|
| 3,738,880 | 6/1973 | Laker | 357/59 X |
| 3,780,359 | 12/1973 | Dumke et al. | 357/34 |
| 3,860,836 | 1/1975 | Pedersen | 357/59 X |
| 4,001,762 | 1/1977 | Aoki et al. | 357/59 X |

OTHER PUBLICATIONS

Neues aus der Technik, No. 3, 15 Jun. 1974 p. 6.

Primary Examiner—Stanley D. Miller, Jr.
Assistant Examiner—James W. Davie
Attorney, Agent, or Firm—Charles W. Helzer

[57] ABSTRACT

Inverted frustum shaped polycrystalline semiconductor layers are formed on the emitter and collector regions provided on one surface of a semiconductor substrate, and conductor layers are applied on the upper surfaces of the polycrystalline semiconductor surfaces to form emitter and collector electrodes thus providing a bipolar transistor for the integrated circuit device.

10 Claims, 19 Drawing Figures

SEMICONDUCTOR INTEGRATED CIRCUIT DEVICES HAVING INVERTED FRUSTUM-SHAPE CONTACT LAYERS

BACKGROUND OF THE INVENTION

This invention relates to a semiconductor integrated circuit device, more particularly a semiconductor integrated circuit device including a bipolar transistor and a method of manufacturing the same.

With recent advances in the art of working, the density of integration of semiconductor integrated circuits has been greatly increased. A typical construction of a prior art integrated circuit device is illustrated in FIG. 1. The integrated circuit device 10 shown therein comprises collector, base and emitter regions 12, 13 and 14 sequentially diffused into one surface of a P type silicon semiconductor substrate 11 by well known techniques and collector, base and emitter electrodes 15, 16 and 17, respectively formed on portions of respective regions to form a bipolar transistor. Reference numeral 18 represents an oxide film, and 19 an embedded or buried layer.

As can be noted from FIG. 1, in the bipolar transistor of the type described above the collector, base and emitter electrodes are arranged on the same plane so that in order to electrically isolate from each other these electrodes it is necessary to insulate them by separating them a certain distance. With the present day working accuracy, the spacing between the electrodes is of the order of 2 to 5 $\mu$m. However, the spacing between respective electrodes is an important factor that determines the occupation area of the bipolar transistor. As described above, it is difficult to decrease the electrode spacing in view of the working accuracy so that it is difficult to increase the density of integration so long as the respective electrodes are disposed on the same plane. Furthermore, the electrode spacing is related directly to the parasitic capacitance at the collector-emitter junction and the PN junctions between respective regions of the transistor, as well as the base resistance, and when the electrode spacing is increased, the parasitic capacitance and the base resistance tend to increase. The limit on the electrode spacing presents an important problem in obtaining a high speed integrated circuit. Further, an increase of the space between electrodes requires long interconnection between elements of the integrated circuit and makes it difficult to arrange interconnecting paths.

Further, with this construction, as it is difficult to self-align the openings or windows of the masks for diffusing the emitter region and for producing respective contacts by photoetching technique, it is necessary to use a high working accuracy of the order of 0.3 $\mu$m. Formation of respective electrodes and interconnection also requires a high working accuracy of the order of 0.3 $\mu$m. The use of a number of steps requiring such a high working accuracy increases the manufacturing cost of the semiconductor integrated circuit devices.

SUMMARY OF THE INVENTION

Accordingly, it is the principal object of this invention to provide a semiconductor integrated circuit device including a stable bipolar transistor that can be manufactured at a high density of integration and a method of manufacturing the integrated circuit device.

Another object of this invention is to provide a semiconductor integrated circuit device including a bipolar transistor that can operate at high speeds and a method of manufacturing the integrated circuit device.

Still another object of this invention is to provide an improved semiconductor integrated circuit device capable of decreasing the spacing between respective electrodes for decreasing the parasitic capacitances existing at the collector-base junction and the P-N junctions between respective regions thus enabling high speed operation.

Yet another object of this invention is to provide an improved semiconductor integrated circuit device including a bipolar transistor having a small base resistance thus improving its high frequency characteristics.

A further object of this invention is to provide a novel method of manufacturing a semiconductor integrated circuit device in which the manufacturing step is simplified by improving self-aligning technique.

Still further object of this invention is to provide a novel method of manufacturing a semiconductor integrated circuit device not requiring highly accurate working techniques.

According to one aspect of this invention there is provided a semiconductor integrated circuit device including a bipolar transistor comprising a semiconductor substrate, a collector region, and a base region and an emitter region which are formed on one surface of the semiconductor substrate, inverted frustum shaped polycrystalline semiconductor layers having larger upper surfaces than the lower surfaces and formed on the emitter region and the collector region respectively, a first insulating film covering the raised side surfaces of the polycrystalline semiconductor layers and overlying the upper surface portions of said substrate which are included within the vertical projection of the raised upper larger cross-sectional surfaces of the inverted frustum-shape polycrystalline contact layers down upon the upper surface of said substrate, a base electrode formed on the base region below the plane of the raised large cross-sectional surfaces of the inverted frustum-shape contact layers, a second insulating film covering the portions of the transistor other than those areas covered by the first insulating film, the base region and the polycrystalline semiconductor contact layers, and an emitter electrode and a collector electrode formed on the upper surfaces of respective polycrystalline semiconductor layers.

According to another aspect of this invention, there is provided a method of manufacturing a semiconductor integrated circuit device comprising the steps of forming a collector region and a base region on one surface of a semiconductor substrate, said collector and base regions being diffused with impurities according to predetermined patterns; forming a first insulating film on the surface of the semiconductor substrate except the portions thereof on which an emitter electrode and a collector electrode are to be provided; forming on the first insulating film a first polycrystalline semiconductor layer doped with an impurity at a high concentration; forming on the first polycrystalline semiconductor layer a second polycrystalline semiconductor layer not doped with any impurity; etching the first and second polycrystalline semiconductor layers according to predetermined patterns for forming first and second inverted frustum shaped polycrystalline semiconductor members respectively on the collector and base regions, diffusing the impurity in the first polycrystalline semiconductor layer comprising the second polycrystalline semiconductor member into the second polycrystalline semiconductor layer to integrally unite the first and the second polycrystalline semiconductor layers into a uniform layer and diffusing an impurity into the base region to form an emitter region; forming a second insulating film on the side surfaces of the first and second polycrystalline semiconductor members and the portions thereof included in the horizontal projections of the first and second polycrystalline semiconductor members; forming a collector electrode and an emitter electrode on the first and second polycrystalline semiconductor members respectively; and forming a base electrode on the base region.

According to a still another aspect of this invention there is provided a method of manufacturing a semiconductor integrated circuit device comprising the steps of forming a collector region and a base region on one surface of a semiconductor substrate, the collector and base regions being diffused with impurities according to predetermined patterns; forming a first insulating film on the surface of the semiconductor substrate except the portions thereof on which an emitter electrode and a collector electrode are to be formed; forming on the first insulating film a first polycrystalline semiconductor layer doped with an impurity at a high concentration; forming on the first polycrystalline semiconductor layer a second polycrystalline semiconductor layer not doped with any impurity; etching the first and second polycrystalline semiconductor layers according to predetermined patterns for forming first and second inverted frustum shaped polycrystalline semiconductor members respectively on the collector region and on the base region; forming a second insulating film on the entire surface of the semiconductor substrate including the first and second polycrystalline semiconductor members; diffusing the impurity in the first polycrystalline semiconductor layer comprising the second polycrystalline semiconductor member into the second polycrystalline semiconductor layer to integrally unite said first and second polycrystalline semiconductor layers into a uniform layer, and diffusing an impurity into the base region to form an emitter region; removing the second insulating film except the portions thereof covering the side surfaces of the first and second polycrystalline semiconductor members and the portions thereof included in the horizontal projections of the first and second polycrystalline semiconductor members; forming a collector electrode and an emitter electrode respectively on the first and second polycrystalline semiconductor members; and forming a base electrode on the base region.

According to another aspect of this invention there is provided a method of manufacturing a semiconductor integrated circuit device comprising the steps of forming a collector region and a base region on one surface of a semiconductor substrate, said collector and base regions being diffused with impurities according to predetermined patterns; forming a first insulating film on the surface of the semiconductor substrate except the portions thereof on which an emitter electrode and a collector electrode are to be formed; forming on the first insulating film a first polycrystalline semiconductor layer doped with an impurity at a high concentration; forming on the first polycrystalline semiconductor layer a second polycrystalline semiconductor layer not doped with any impurity; etching the first and second polycrystalline semiconductor layers to form first and second inverted frustum shaped polycrystalline semiconductor members on the collector and base regions respectively and extending to portions connected to the collector and emitter electrodes; forming a second insulating film over the entire surface of the semiconductor substrate including the first and second polycrystalline semiconductor members; diffusing the impurity in the first polycrystalline semiconductor layer comprising the second polycrystalline semiconductor member into the second polycrystalline semiconductor layer to integrally unite the first and second polycrystalline semiconductor layers into a uniform layer; diffusing an impurity into the base region to form an emitter region; removing the second insulating film except the portions thereof covering the side surfaces of the first and second polycrystalline semiconductor members, the portions thereof included in the horizontal projections of the first and second polycrystalline semiconductor members, and the portions thereof on which resistors are to be formed; forming a collector electrode and an emitter electrode respectively on the first and second polycrystalline semiconductor members; forming a base electrode on the base region; forming lead wires connected to the collector and emitter electrodes respectively; and separating the lead wires from the portion of the second insulating film remaining for the purpose of forming the resistors on the polycrystalline semiconductor members.

According to another aspect of this invention there is provided a method of manufacturing a semiconductor integrated circuit device comprising the steps of forming a base region and a collector region on one surface of a semiconductor substrate, said base and collector regions being diffused with impurities according to predetermined patterns; forming a first insulating film on the surface of the semiconductor substrate except the portions thereof on which an emitter electrode and a collector electrode are to be formed; forming on the first insulating film a first polycrystalline semiconductor layer doped with an impurity at a high concentration; forming on the first polycrystalline semiconductor layer a second polycrystalline semiconductor layer not doped with any impurity; etching the first and second polycrystalline semiconductor layers to form first and second inverted frustum shaped polycrystalline semiconductor members respectively on the collector and base regions; forming a second insulating film on the entire surface of the semiconductor substrate including the first and second polycrystalline semiconductor regions; diffusing the impurity in the first polycrystalline semiconductor layer comprising the second polycrystalline semiconductor member into the second polycrystalline semiconductor layer for integrally uniting the first and second polycrystalline semiconductor layers into a uniform layer; diffusing an impurity into the base region to form an emitter region; removing the second insulating film except the portions thereof covering the side surfaces of the first and second polycrystalline semiconductor members and the portions thereof included in the horizontal projections of the first and second polycrystalline semiconductor members; forming a collector electrode and an emitter electrode respectively on the first and second polycrystalline semiconductor members; forming a base electrode on the base region; and forming a first wiring layer on the first insulating film.

According to yet another aspect of this invention there is provided a method of manufacturing a semiconductor integrated circuit device comprising the steps of forming a collector region and a base region on one surface of a semiconductor substrate by diffusing impurities according to predetermined patterns; forming a first insulating film on the surface of the semiconductor substrate except the portions thereof on which an emitter electrode and a collector electrode are to be formed; forming on the first insulating film a first polycrystalline semiconductor layer doped with an impurity at a high concentration; removing a portion of the first polycrystalline semiconductor layer at which an electric connection is to be made at a stepped portion; forming on the first polycrystalline semiconductor layer a second polycrystalline semiconductor layer not doped with any impurity; etching said first and second polycrystalline semiconductor layers according to predetermined patterns to form first and second inverted frustum shaped polycrystalline semiconductor members respectively on the collector and base regions and to form stepped portions on the first and second polycrystalline semiconductor members which are connected to the collector and emitter electrodes respectively; forming a second insulating film on the entire surface of the semiconductor substrate including the first and second polycrystalline semiconductor members; diffusing the impurity in the first polycrystalline semiconductor layer comprising the second polycrystalline semiconductor member into the second polycrystalline semiconductor layer for integrally uniting the first and second polycrystalline semiconductor layers into a uniform layer, diffusing an impurity into the base region to form an emitter region; forming a second insulating film only on the side surfaces of the first and second step shaped polycrystalline semiconductor members and the portions thereof included in the horizontal projections of the first and second step shaped polycrystalline semiconductor members; forming a collector electrode and an emitter electrode on the first and second polycrystalline semiconductor members respectively; forming a base electrode on the base region; and forming a wiring conductor on the first insulating film to extend on the upper surface of the step shaped polycrystalline semiconductor member.

BRIEF DESCRIPTION OF THE DRAWINGS

Further objects and advantages of the invention can be more fully understood from the following detailed description taken in conjunction with the accompanying drawings in which.

DESCRIPTION OF THE PREFERRED EMBODIMENTS

Figure 1:
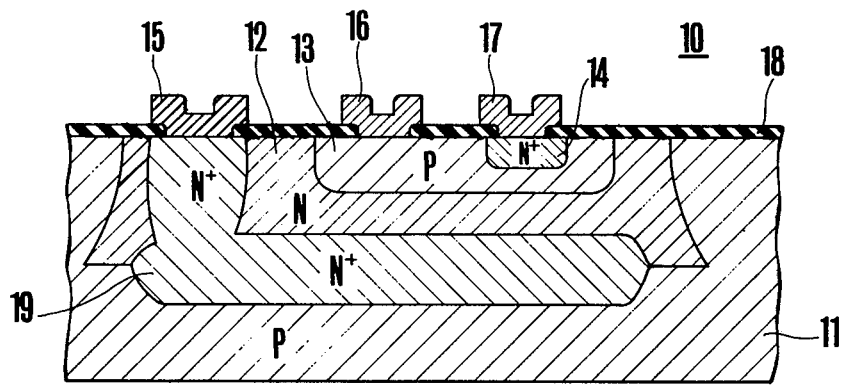
FIG. 1 is a longitudinal sectional view showing one example of a prior art semiconductor integrated circuit device.
Figure 2:
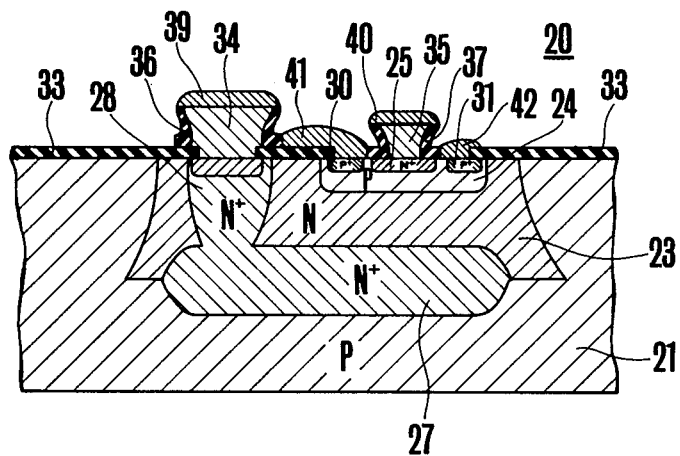
FIG. 2 is a longitudinal sectional view of a bipolar transistor showing one embodiment of the semiconductor integrated circuit device embodying the invention.

FIG. 2 shows the bipolar transistor portion of one embodiment of a semiconductor integrated circuit device 20 embodying the invention, in which reference numeral 21 shows a P type semiconductor substrate carrying an N type silicon epitaxial layer 23 formed on its upper surface. A P type impurity is diffused in a portion 24 of the epitaxial layer within the semiconductor substrate 21 to separate the elements for forming a collector region 23. The P type impurity diffused into a portion of the collector region 23 forms a base region 24, and an N type impurity is diffused into a portion of the base region 24 to form an $N^+$ emitter region 25. Between the substrate 21 and the collector region 23 is formed a buried layer 27 having an $N^+$ contact region 28 formed in the collector region 23. $P^+$ contact regions 30 and 31 are formed in the base region 24. There are also provided an insulating film 33 made of $SiO_2$, for example, an $N^+$ polycrystalline semiconductor region 34 projecting upwardly through an opening of the insulating film 33 and connected to the contact region 28, and an $N^+$ polycrystalline semiconductor region extending upwardly through an opening of the insulating film 33 and connected to the emitter region 25. These polycrystalline regions 34 and 35 are of an inverted frustum form having an upper surface larger than the bottom surface and the side surfaces of these regions are covered by insulating films 36 and 37 made of $SiO_2$, for example. The lower portion of the insulating film 36 extends laterally on the surface of the insulating film 33, said lower portion being included in the horizontal projection of the polycrystalline semiconductor region 34. In the same manner, the lower portion of the insulating film 37 extends in the lateral direction on the surface of the semiconductor substrate 21, the lower portion being also included in the horizontal projection of the polycrystalline semiconductor region 35. Electroconductive layers 39 and 40, made of metal or other electroconductive substance, are formed on the exposed upper surfaces of the polycrystalline semiconductor regions 34 and 35. The conductive layers 39 and 40 form collector and emitter electrodes respectively together with polycrystalline semiconductor regions 34 and 35. Electroconductive layers 41 and 42 are formed to cover the contact regions 30 and 31 of the base region 24 to form a base electrode. Portions of the layers 41 and 42 extend to cover the insulating film 33.

This construction has a number of advantages as enumerated in the following.

(1) It is possible to arrange the collector and emitter electrodes as cubical members with respect to other elements, for example the base electrode. Accordingly, it is possible to reduce to substantially zero the horizontal spacings between the collector and base electrodes and between the emitter and base electrodes. In other words, it is possible to minimize the base and collector areas of the transistor and thereby reducing the occupation area of the transistor. As a consequence it is possible to increase the density of integration of the semiconductor integrated circuit device over the prior art device. Assuming constant emitter, base and collector areas; and accuracy of position alignment of 2 $\mu m$ it is possible to reduce the base area to 1/2.6 to 1/2.8 when compared with the prior art construction and the occupation area of the transistor can be decreased to about 1/1.6 of the prior art construction.

(2) In addition to the decrease in the base area and the occupation area of the transistor as described above, it is also possible to increase the density of integration due to the increase in the density of the interconnections. For example, a 4 bit arithmetic logic unit utilizing a basic gate comprising a non-threshold logic circuit was manufactured and found that the tip area was reduced to about 1/2.2.

(3) Further, as the base area of the bipolar transistor decreases, the collector-base capacitance decreases correspondingly thus enabling the transistor to operate at a high speed, which in turn makes it possible to provide a semiconductor integrated circuit capable of operating at a high speed.

(4) Further, the decrease in the occupation area of the bipolar transistor results in the corresponding decrease in the element separation capacitance which also contributes to the high speed operation of the semiconductor integrated circuit device.

(5) According to the construction of this invention, it is possible to decrease the base resistance of the bipolar transistor by one order of magnitude. More particularly, according to this invention it is possible to make smaller the spacing between the emitter region and the base contact region than with the prior art construction. Moreover since even when the base is duplicated the base area does not increase appreciablly so that it is possible to readily decrease the base resistance by duplicating the base.

(6) For the reasons described in items (3), (4) and (5) it is possible to improve the switching characteristic of the basic gate of the arithmetic logic circuit, for example by a factor of 1.5 to 2.0 in terms of the transmission delay time than the prior art construction.

(7) Further, as the side and lower portions of the polycrystalline semiconductor regions are covered by insulating films, there is no problem of insulation between these polycrystalline semiconductor regions and interconnections provided close to these regions.

(8) In addition, according to this construction, it is possible to solve various manufacturing problems as will be described later, thus enabling to manufacture semiconductor integrated circuit devices at a lower cost.

Successive steps of manufacturing a semiconductor integrated circuit device according to one example of the method of this invention will now be described with reference to FIG. 3A through FIG. 3I.

Figure 3A:
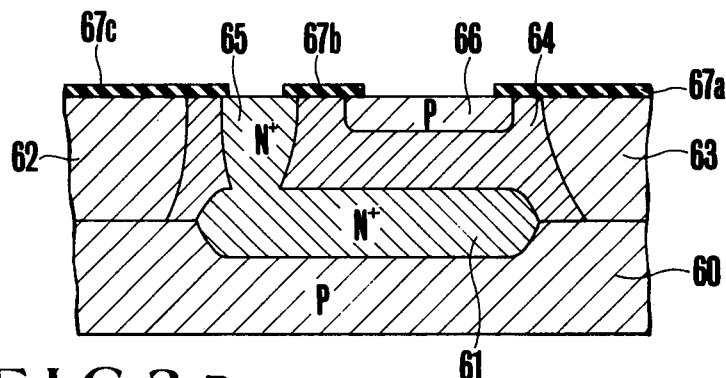
FIGS. 3A through 3I are longitudinal sectional views showing various steps of the method of fabricating the embodiment of the invention shown in FIG. 2.

A. A P type silicon semiconductor substrate 60 is prepared having a thickness of about 200 microns and a specific resistance of from 5 to 50 $\Omega$-cm. Then arsenic is diffused into one surface of the substrate to form a buried N layer 61 having a heat resistance of about 5 to 15 $\Omega/\square$. Then an N type silicon layer 62, 63 having a resistivity of 0.2 to 1 ohm cms is epitaxially grown on the semiconductor substrate 60 to a thickness of 2 to 3 microns. Thereafter a silicon dioxide film ($SiO_2$) 67a, 67b and 67c having a thickness of about 0.4 to 0.6 $\mu$m is formed and openings are formed through this film according to a prescribed pattern. Then a P type impurity, for example boron is diffused through these openings to a depth of about 3.5 microns to provide a surface concentration of $1 \times 10^{20}/cm^3$ thereby forming collector region 64 and separating regions 62 and 63. An oxide film is again formed to cover the entire surface of the N type silicon layer and a portion of the oxide film is removed according to a predetermined pattern. Then an N type impurity, for example arsenic or phosphor is diffused through the removed portion into a portion of the collector region 64 formed by the separating diffusion described above to a depth of about 2 to 2.5 $\mu$m and to a surface concentration of $10^{20}/cm^3$, thereby forming a contact region 65 to the buried N layer 61. Another portion of the oxide film is removed according to a predetermined pattern and boron is diffused into the exposed surface of the collector region 64 to a surface concentration of $5 \times 10^{18}$ to $1 \times 10^{19}/cm^3$, thus forming a base region 66. Then the oxide film on the base region 66 and the contact region 65 is removed. This state is shown in FIG. 3A, in which 67a, 67b and 67c show remaining oxide film.

Figure 3B:
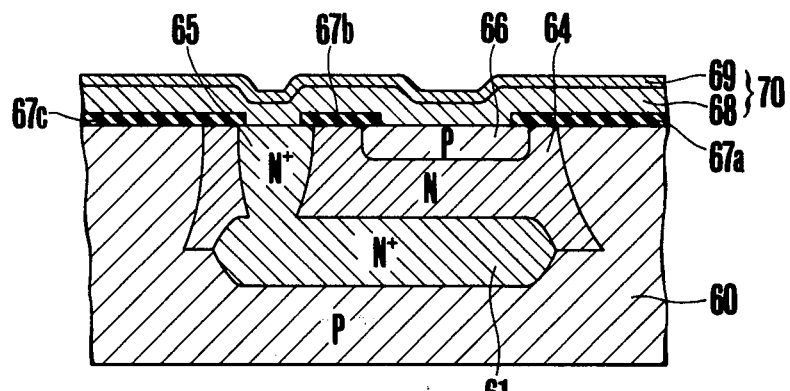

B. Then the semiconductor substrate 60 shown in FIG. 3A (for simplicity the combination of parts 60 and 63 is designated by 60) is heated in an atmosphere containing a silane and an N type impurity, for example arsenic, in a manner well known in the art to form a first polycrystalline silicon layer 68 on the surface of the semi-conductor substrate 60, said silicon layer being doped with arsenic at a high concentration of higher than $1 \times 10^{20}/cm^3$ and having a thickness of about 0.4 $\mu$m. Thereafter a second polycrystalline silicon layer 69 having a thickness of about 0.15 to 0.2 $\mu$m is formed in an atmosphere containing a silane alone, that is in a non-doping condition. In this case the atmosphere may not be a perfect non-doping state and may contain arsenic of an amount resulting in a surface concentration of less than $10^{18}/cm^3$. Accordingly, the term non-doping is utilized herein to also cover such atmosphere containing a small amount of an impurity. As a result, there is formed a polycrystalline silicon layer 70 having a total thickness of 0.55 to 0.6 $\mu$m which is the sum of the thicknesses of said two polycrystalline silicon layers. This state is shown in FIG. 3B.

Figure 3C:
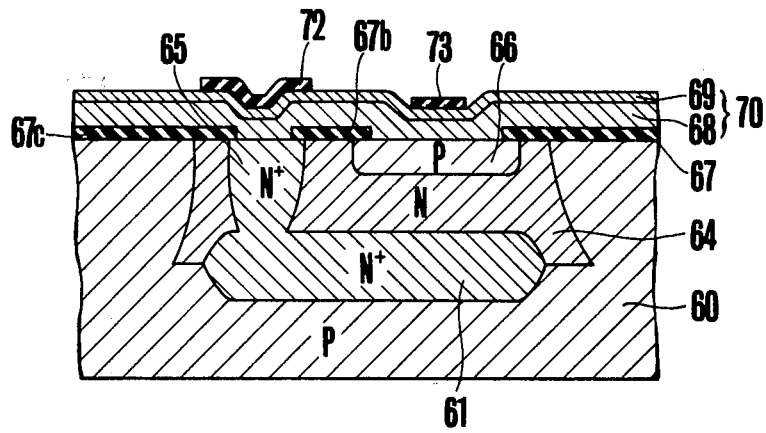

C. Then an oxide film, for example an $SiO_2$ film is formed on the polycrystalline silicon layer 70 and this oxide film is etched according to a prescribed pattern. FIG. 3C shows this state wherein 72 and 73 represents the $SiO_2$ films used as masks. Portions of the $SiO_2$ films 72 and 73 are preserved corresponding to the collector and emitter electrodes, respectively, and the lead wires connected thereto. Instead of the $SiO_2$ films photoresists can also be used as the masks.

Figure 3D:
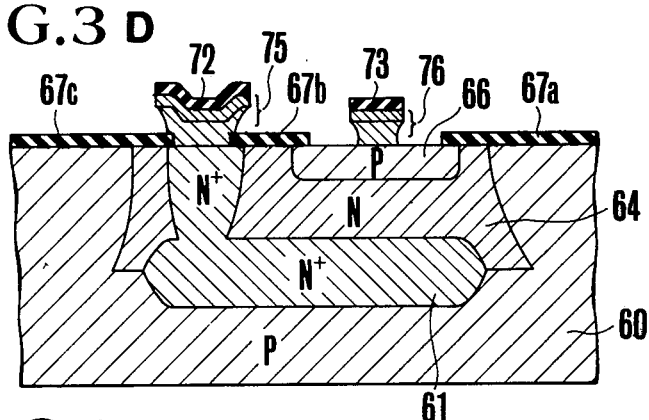

D. The polycrystalline silicon layer 70 is then etched with an etching solution containing HF, $HNO_3$ and $H_2O$ at a ratio of 1:60:60. Such etching solution has a property that the etching speed is increased as the amount of impurity contained in the polycrystalline silicon layer increases. For example the etching speed for a polycrystalline silicon layer containing an impurity at a concentration of higher then $10^{20}$ atoms/$cm^3$ is faster by one order of magnitude than that for a polycrystalline silicon layer containing an impurity at a concentration of $10^{17}$–$10^{18}$ atoms/$cm^3$. As a consequence, by the etching step, two inverted frustum shaped islands 75 and 76 are formed in the polycrystalline silicon layer 70 having larger upper area than the lower area, as shown in FIG. 3D. Advantageously, the etching time ranges from 5 to 5.5 minutes.

E. The surface of the semiconductor substrate 60 is cleaned by heated nitric acid and a thin oxide film is formed thereon, which is removed by an etching solution of the HF type. By this step impurities and the stain film on the surface of the semiconductor substrate 60 are completely removed. Thereafter an $SiO_2$ film is formed on the cleaned surface of the substrate 60 by a well known heat decomposition method and an $Si_3N_4$ film acting as a protective insulating film 78 is formed on the $SiO_2$ film.

Where it is necessary to form a diffused base layer by a later step, a desired amount of boron is incorporated into the portion of the $SiO_2$ film corresponding to the base region 66. Instead of providing the $Si_3N_4$ film the SiO₂ film can be used as the protective insulating film 78.

Figure 3E:
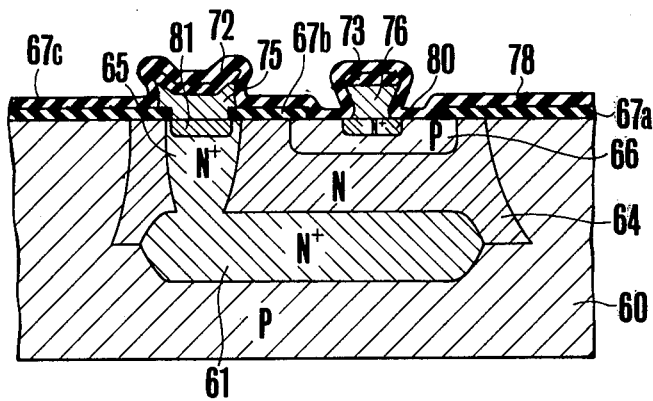

Then, the assembly is heat treated in an atmosphere of N₂ or O₂ for 10 minutes at a temperature of 1000° C., for example to cause the impurity (arsenic) contained in the polycrystalline silicon layer to diffuse into the base region 66 thus forming a diffused emitter region 80. Where the insulating film 78 contains boron, the boron is diffused into the corresponding base region. At the same time, the impurity (arsenic) in the polycrystalline silicon layer (the remaining portion of layer 68) is caused to diffuse into the non-doped polycrystalline silicon layer (the remaining portion of film 69) which constitute the duplicate polycrystalline silicon layer 75 and 76 thereby making the same the concentrations of the impurity in the doped and nondoped polycrystalline silicon layer thus uniting both layers into an integral layer. At the same time, a diffused layer 81 having the same depth as the emitter region 80 is formed in the contact region 65 of the collector region. FIG. 3E shows this state.

F. Then, ions of boron, argon or phosphor are injected from above. It is advantageous to select the acceleration voltage of the ions such the concentration of the impurity reaches a maximum in the insulating film 78 or the interface between it and the semiconductor substrate 60. The amount of the injected ions is determined such that the difference in the etching speed of the portion of the insulation injected with the ions and the portion not injected with the ions will be a maximum in the later chemical etching step. For example when the boron ions are accelerated at a voltage of 40 KV the dose is about $1 \times 10^{15}/cm^2$. In this case no ion is injected into the insulating films 83 and 84 on the sides of inverted frustum shaped polycrystalline silicon layers comprising the emitter and collector portions and into the insulating films continuous to the insulating films 83 and 84, respectively, and included in the projections of the inverted frustum shape polycrystalline silicon layers 75 and 76 on the surface of the semiconductor substrate 60.

Figure 3F:
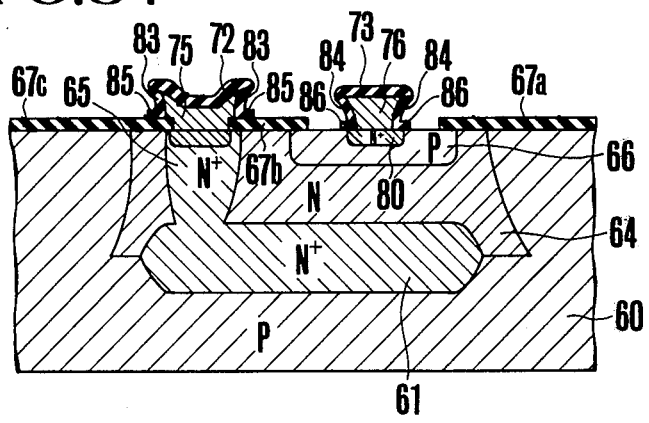

When boron is implanted at the dose of $1 \times 10^{15}/cm^2$, the etching speeds of the portions injected with boron ions is 2 to 3 times for an SiO₂ film when buffered hydrofluoric acid solution is used, and 3 to 4 times for an Si₃N₄ film when boiled phosphoric acid (at a temperature of 160° to 170° C.) higher than the speed of the non-injected portion. Accordingly, by using a suitable etching solution it is possible to selectively etch off ion injected portions while preserving portions of the insulation films 83–86 not injected with the ions. Since the insulating films 72 and 73 and the mask that has been used to work the polycrystalline silicon layer are not injected with the ions or injected with only a small number of the ions they are not removed by etching. This state is shown in FIG. 3F.

Figure 3G:
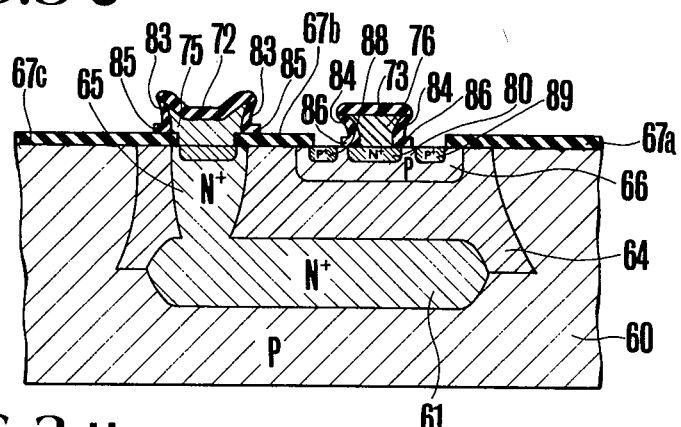

G. Where it is desired to form a P+ diffused layer in the region forming the base contact of the base region 66 a P type impurity, for example boron, is diffused by a well known vapour phase diffusion technique to form P+ diffused layers 88 and 89 having a desired depth. This state is shown in FIG. 3G.

Figure 3H:
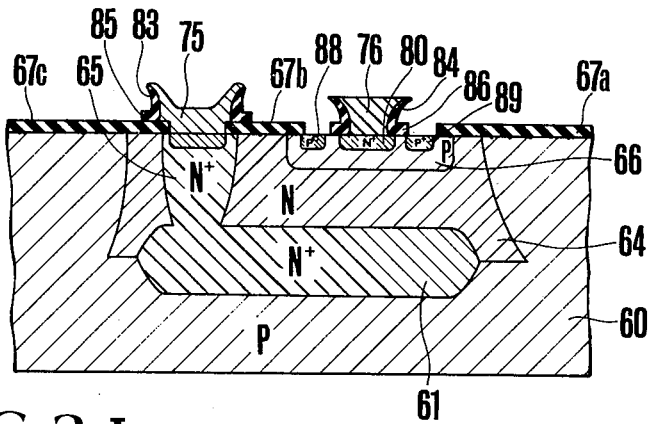

H. Then, the insulating films 72 and 73 that have been used as the masks for working the polycrystalline silicon layers 75 and 76 are removed by chemical etching technique. This state is shown in FIG. 3H.

Figure 3I:
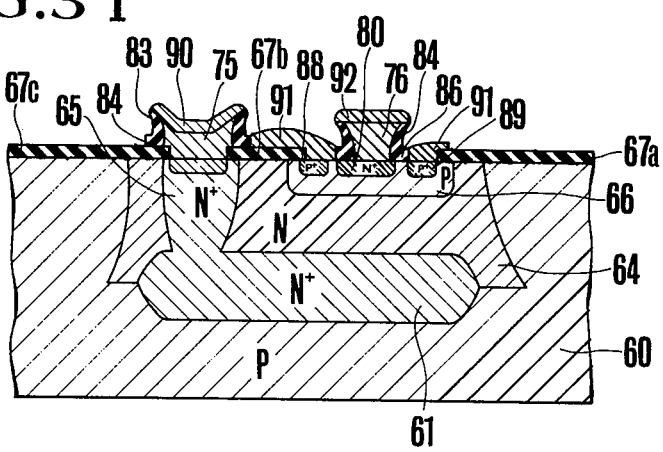

I. Then, a metal such as aluminum, molybdenum or tungsten is vapour deposited from above to a thickness of about 0.3 μm on the polycrystalline silicon layers 75 and 76, base contact regions 88 and 89 and other predetermined portions. By making the vapour deposited metal layer to be thinner than the inverted frustum shaped polycrystalline silicon layers 75 and 76 the side surfaces of the polycrystalline silicon layers 75 and 76 will be shielded during vapour deposition so that metal will not deposit on these side surfaces. As a consequence, the collector electrode 90 and the base electrode 91, and the base electrode 91 and the emitter electrode 92 are separated in the vertical direction, these spacings being automatically determined by the level difference of the shoulders formed about the collector and emitter electrodes 90 and 92. For this reason, the working accuracy of the electrodes may be about one order of magnitude lower than that of the prior construction. The metal film deposited on a region not requiring the deposition is removed by well known photoetching etching thus forming an integrated circuit device including a bipolar transistor as shown in FIG. 3I and FIG. 2. Instead of forming the electroconductive layer with metal, electroconductive substances other than metal can be blasted from above to form a conductive layer on the polycrystalline silicon film.

Figure 4:
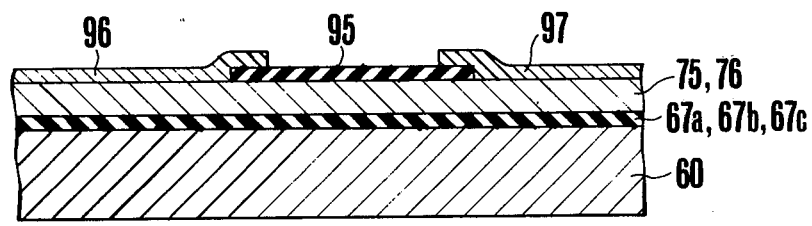
FIGS. 4 and 5 are longitudinal sectional views showing another embodiment of this invention.

The semiconductor integrated circuit thus obtained is contained in a casing to complete the device. While the above description relates to a bipolar transistor in terms of an integrated circuit a resistor is formed by a diffused resistor or polycrystalline silicon as in the prior art. For example in step (H) described above wherein the insulating films 72 and 73 which were used as masks for working the polycrystalline silicon layer are removed by photoetching a portion of the insulating film 95 having a length corresponding to a resistor is preserved, and in the next step (I) a predetermined length of the portion of the metal film deposited on the insulating film which short circuits the resistor is removed. Then the portion of the polycrystalline silicon layer underlying the insulating film sandwiched between conductors 96 and 97 can be used as a resistor. FIG. 4 shows one example of a resistor prepared in this manner.

Further, according to this invention a diode can be formed by using the PN junction between the emitter region 80 and the base region 66 or the PN junction between the base region 66 and the collector region 64.

Figure 5:
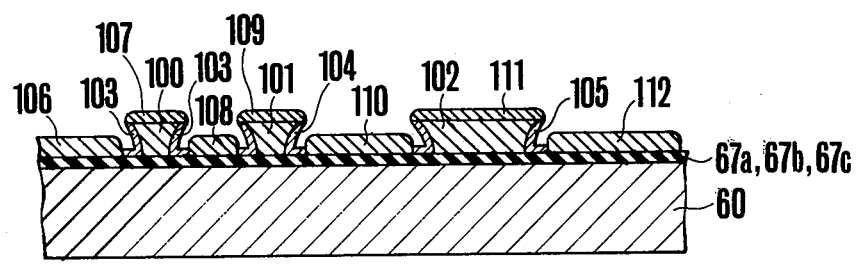

It is possible to use the portion comprising the polycrystalline silicon layers 75 and 76 that form the collector electrode 90 and the emitter electrode 92 and the vapour deposited metal as the interconnections for interconnecting the transistor and the resistor element of the integrated circuit. The lead wire leading from the emitter or collector electrode and the lead wire leading from the base electrode are separated from each other by a shoulder formed on the side surface of the polycrystalline silicon layer. As shown in FIG. 5, since these lead wires are not required to be separated in the horizontal direction it is possible to readily increase the density of integration. In FIG. 5, reference numerals 100, 101 and 102 show polycyrstalline layers corresponding to the polycrystalline silicon layers 75 and 76 shown in FIG. 3, reference numerals 103, 104 and 105 show insulating films covering the side surface and the bottom portion of the polycrystalline silicon layers 100, 101 and 102 and 106 - 112 show interconnecting conductors formed by vapour deposition. The method of this invention has the following advantages.

(1) According to this invention, the contact window for the base region ensures self alignment of the electrode forming so that it is not necessary to use highly accurate photoetching steps and electrode forming steps which have been required heretofore to fabricate a transistor of the integrated circuit type.

(2) Due to the self alignment described above it is possible to eliminate certain steps, for example the step of forming a window for forming the base contact by photoetching technique thereby decreasing the manufacturing cost.

Although in the foregoing embodiment a silicon semiconductor was used as a substrate, the substrate may be made of other semiconductors such as germanium and gallium-arsenic alloys. Further, instead of a P type substrate, an N type substrate can also be used.

Further, the protective insulative film 78 shown in FIG. 3E may be formed after carrying out the emitter diffusion.

Figure 6:
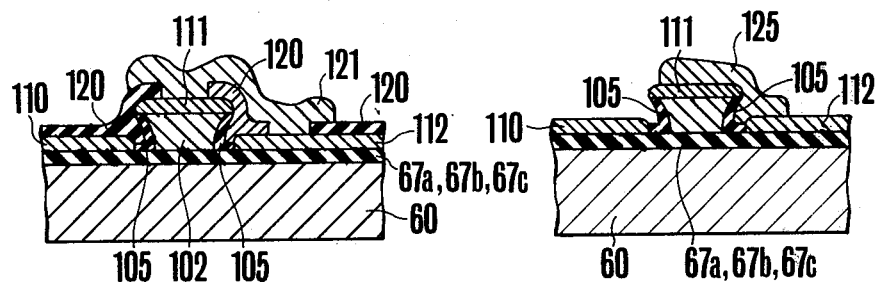
FIGS. 6 and 7 are longitudinal sectional views showing still another embodiment of this invention.

In certain semiconductor integrated circuit devices it is necessary to make connection at the shoulders. For example, to connect two layer interconnections and the inverted frustum shaped polycrystalline silicon layer, a construction shown in FIG. 6 can be used. Thus, FIG. 6 shows the electrical connection between the polycrystalline silicon layer 102 shown in FIG. 5 and an interconnecting conductor 112. After adding an interlayer insulating film 120 to the construction shown in FIG. 5, through holes are formed through interconnection conductors 111 and 112 by photoetching technique and then a second metal film interconnecting conductor 121 is formed by vapour deposition to fill these two through openings.

Figure 7:
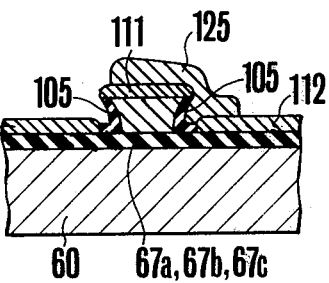

Alternatively, after forming the first layer wiring conductor the thickness of the metal layer is increased at the connecting portion for connecting with the inverted frustum shaped polycrystalline silicon layer as shown in FIG. 7. To this end after forming the interconnecting conductors 111 and 112 shown in FIG. 5, a mass of metal 125 is added to the connecting portion by photoetching technique.

Where it is desired to connect the first layer wiring conductor to the inverted frustum shaped polycrystalline silicon layer at the time of forming the former, the steps shown in FIGS. 8A to 8D are used.

Figure 8A:
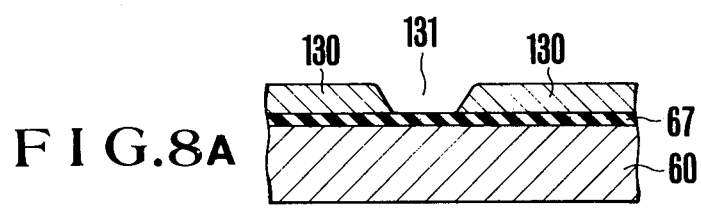
FIGS. 8A through 8D are sectional views showing various steps of manufacturing a further modified embodiment of the invention.
Figure 8B:
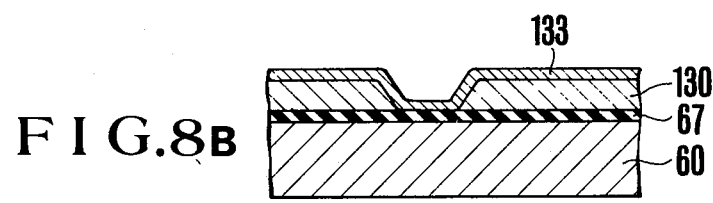
Figure 8C:
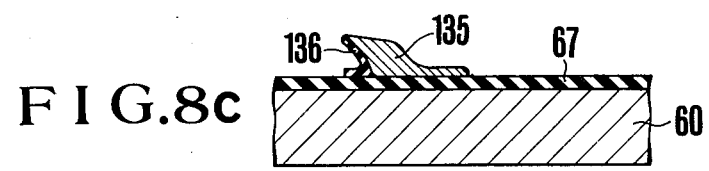
Figure 8D:
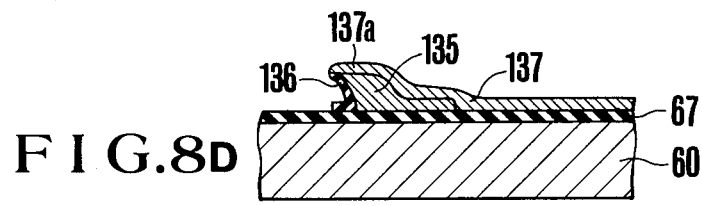

More particularly, a polycrystalline silicon layer 130 doped with arsenic at a high concentration is formed on an oxide film 67 overlying a semiconductor substrate 60, the arsenic-doped polycrystalline silicon layer 130 at the connecting portion 131 is removed as shown in FIG. 8A. Then, as shown in FIG. 8B, a non-doped polycrystalline silicon layer 133 is formed on the arsenic-doped polycrystalline silicon layer 130, and then an inverted frustum is formed by the identical steps as in the previous embodiment to preserve only a step shaped polycrystalline silicon layer 135 comprising the non-doped polycrystalline layer 133 with the connecting portion 131 and the portions of the two polycrystalline silicon layers 130, 133 to the left thereof. Thus the polycrystalline silicon layer 135 comprises doped and non-doped polycrystalline silicon layers and is converted into a homogeneous concentration by a heat treatment. The lefthand side surface at the highest level of the polycrystalline silicon layer and the lower portion thereof are covered by an insulating film 136 which is applied in a manner described above. This state is shown in FIG. 8C. Then a first layer interconnecting conductor 137 is applied by vapour depositing metal to cover the inverted frustum step-shaped polycrystalline silicon layer 135. With this construction the interconnecting conductor 137 is applied stepwisely from the oxide film 67 to the polycrystalline silicon layer 137a so that there is no interruption of the interconnecting conductor at the shoulders or steps.

What is claimed is:

1. A semiconductor integrated circuit device including a bipolar transistor comprising a semiconductor substrate, a collector region, a base region and an emitter region which are spaced apart and formed at one surface of said semiconductor substrate, a plurality of inverted frustum-shape polycrystalline semiconductor contact layers having raised upper larger cross sectional surfaces and lower smaller cross sectional surfaces, one of said inverted frustum-shape polycrystalline semiconductor contact layers being formed on and in direct contact with each of said emitter region and said collector region, respectively, a first insulating film covering the raised side surfaces of said inverted frustum-shaped polycrystalline semiconductor contact layers and overlying the upper surface portions of said substrate which are included substantially within the vertical projection of the raised upper larger cross sectional surfaces of the inverted frustum-shape polycrystalline semiconductor contact layers down upon the upper surface of said substrate, a second insulating film covering the surface portions of said one surface of said substrate other than those areas covered by said first insulating film, the contact layers and said base region, a base electrode formed on said base region below the plane of the raised upper larger cross sectional surfaces of the inverted frustum-shape polycrystalline semiconductor contact layers and an emitter electrode and a collector electrode formed on the upper surfaces of the respective inverted frustum-shape polycrystalline semiconductor contact layers.

2. A semiconductor integrated circuit device according to claim 1 wherein the inverted frustum-shape polycrystalline semiconductor contact layers each are comprised of two layers, a polycrystalline silicon layer having a high dopant level comprising the lower smaller cross sectional surfaces thereof and a non-doped semiconductor polycrystalline layer comprising the raised upper larger cross sectional surfaces thereof, the two layers having been differentially etched by an etchant to form the inverted frustum-shape and thereafter heated to form a substantially homogeneous contact layer.

3. A semiconductor integrated circuit device according to claim 1 wherein at least a part of said second insulating film covering the upper surface portions of said substrate immediately surrounding said emitter inverted frustum-shape contact layer extends onto and overlies a peripheral edge portion of said base region.

4. A semiconductor integrated circuit device according to claim 3 wherein the inverted frustum-shape polycrystalline semiconductor contact layers each are comprised of two layers, a polycrystalline silicon layer having a high dopant level comprising the lower smaller cross sectional surfaces thereof and a non-doped semiconductor polycrystalline layer comprising the raised upper larger cross sectional surfaces thereof, the two layers having been differentially etched by an etchant to form the inverted frustum-shape and thereafter heated to form a substantially homogeneous contact layer.

5. The semiconductor integrated circuit device according to claim 4 which further comprises at least one additional area of polycrystalline semiconductor layer disposed over at least a portion of said second insulating film and a metal conductor disposed on said additional area of polycrystalline semiconductor layer, a portion of said last-mentioned metal conductor being interrupted by a third insulating film thereby enabling use of said additional area of polycrystalline semiconductor layer as a resistor.

6. The semiconductor integrated circuit device according to claim 1 which further comprises at least one additional area of polycrystalline semiconductor layer disposed over at least a portion of said second insulating film and a metal conductor disposed on said additional area of polycrystalline semiconductor layer, a portion of said last-mentioned metal conductor being interrupted by a third insulating film thereby enabling use of said additional area of polycrystalline semiconductor layer as a resistor.

7. The semiconductor integrated circuit device according to claim 1 which further comprises interconnecting conductors connected to said collector and emitter electrodes, and an interconnecting conductor to said base electrode, said interconnecting conductors being spaced from each other by a step-shaped portion of the first insulating film covering the side surfaces of said inverted frustum-shape polycrystalline semiconductor contact layers.

8. The semiconductor integrated circuit device according to claim 1 which further comprises a first interconnecting conductor disposed on said second insulating film adjacent at least one of said inverted frustum-shape polycrystalline semiconductor contact layers, a third insulating film overlying said one polycrystalline semiconductor contact layer and said first interconnecting conductor, and a second interconnecting conductor overlying said third insulating film and extending through openings in said third insulating layer to contact and interconnect the electrode on said one polycrystalline semiconductor contact layer and said first interconnecting conductor.

9. The semiconductor integrated circuit device according to claim 1 which further comprises a first interconnecting conductor disposed on said second insulating film adjacent at least one of said inverted frustum-shape polycrystalline semiconductor contact layers, and a second interconnecting conductor directly covering the electrode on said one polycrystalline semiconductor contact layer and said first interconnecting conductor for interconnecting them.

10. The semiconductor integrated circuit device according to claim 1 wherein a step-shaped raised polycrystalline semiconductor member is formed on said second insulating film, and said integrated circuit device further comprises an insulating film covering at least the raised side surfaces of said step-shaped polycrystalline semiconductor member, and an interconnecting conductor disposed on said second insulating film and extending over and contacting the upper surfaces of said step-shaped polycrytalline semiconductor member.

* * * * *